(12) United States Patent
Coppin et al.

(10) Patent No.: US 6,492,838 B2
(45) Date of Patent: Dec. 10, 2002

(54) SYSTEM AND METHOD FOR IMPROVING PERFORMANCE OF DYNAMIC CIRCUITS

(75) Inventors: Justin Allan Coppin, Fort Collins, CO (US); Jonathan P Lotz, Ft Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/833,512

(22) Filed: Apr. 11, 2001

(65) Prior Publication Data

US 2002/0149393 A1 Oct. 17, 2002

(51) Int. Cl.$^7$ .................................. H03K 19/096
(52) U.S. Cl. .................................. 326/95; 326/98
(58) Field of Search ..................... 326/95, 98, 93; 365/203

(56) References Cited

U.S. PATENT DOCUMENTS

| | | | | |
|---|---|---|---|---|
| 5,821,778 A | * | 10/1998 | Bosshart | 326/95 |
| 6,222,234 B1 | * | 4/2001 | Imai | 257/347 |
| 6,225,827 B1 | * | 5/2001 | Fujii et al. | 326/98 |

\* cited by examiner

*Primary Examiner*—Don Phu Le
*Assistant Examiner*—James H. Cho

(57) ABSTRACT

In one embodiment, a circuit is provided that includes a precharge device, a DNG FET transistor, and at least one pull-down FET transistor with a floating body. The precharge device is connected to a precharge node for charging it during a precharge state. The DNG FET transistor is connected between a DNG node and a charge sink for operably linking the DNG node to the charge sink during an evaluate state. In addition, the DNG transistor has an associated precharge leakage current. The at least one pull-down FET transistor has an input threshold voltage whose value is inversely affected by its floating body voltage. The at least one pull-down transistor is connected between the precharge node and the DNG node for discharging the precharge node during the evaluate state if so dictated by logical function input values applied to the pull-down transistors during the evaluate state. The DNG leakage current, during the precharge state, draws a sufficient amount of charge from the DNG node to maintain the at least one pull-down transistor body voltage(s) at a sufficiently low value so that the precharge node does not wrongfully evaluate to a discharge level during the evaluate state.

22 Claims, 2 Drawing Sheets

FIG. 1
(Prior Art)
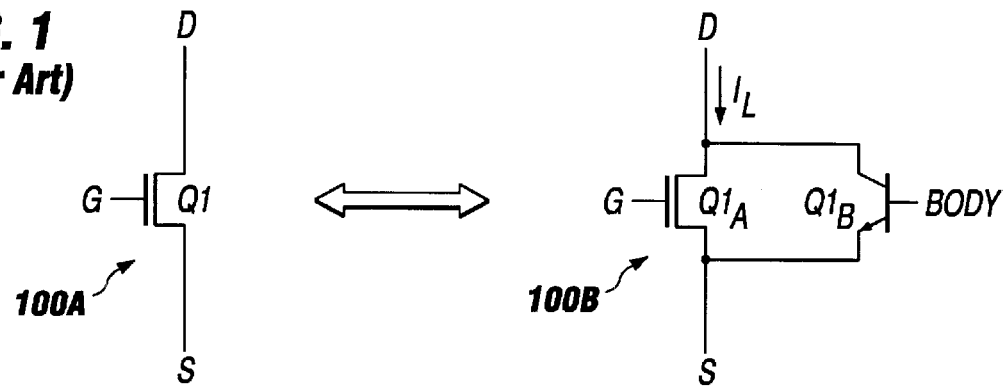
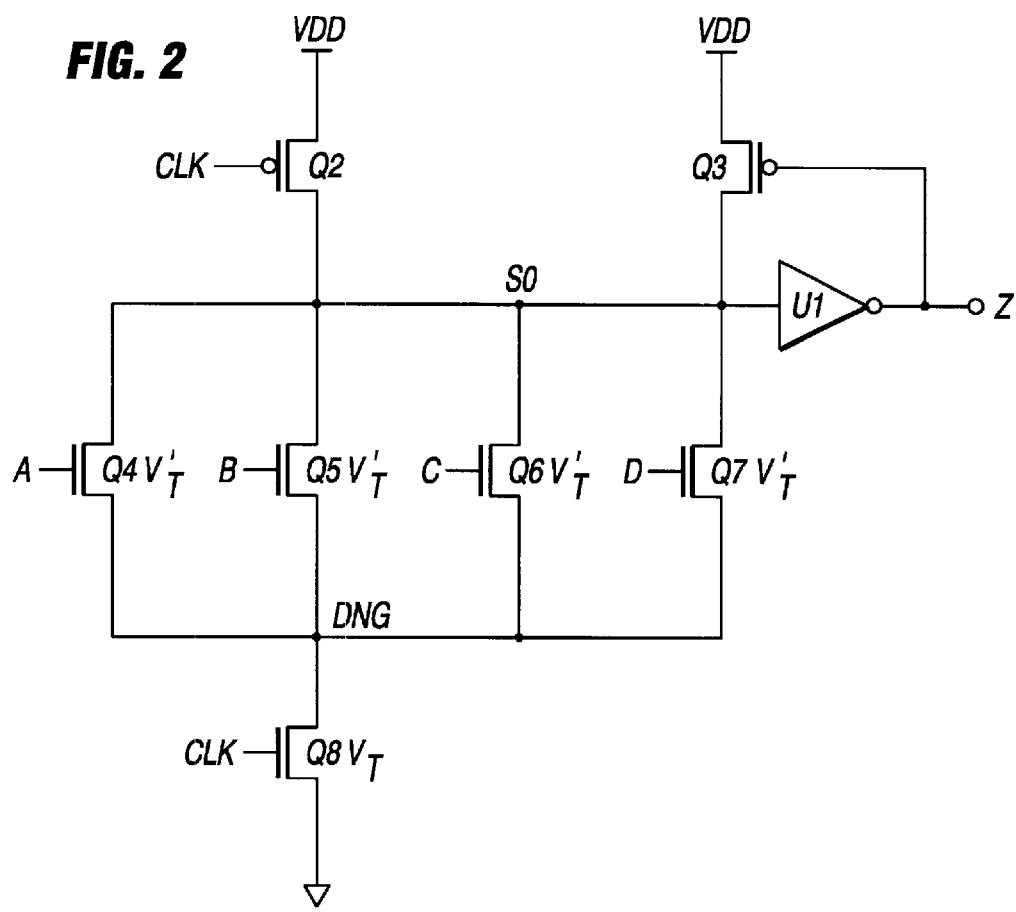
FIG. 2

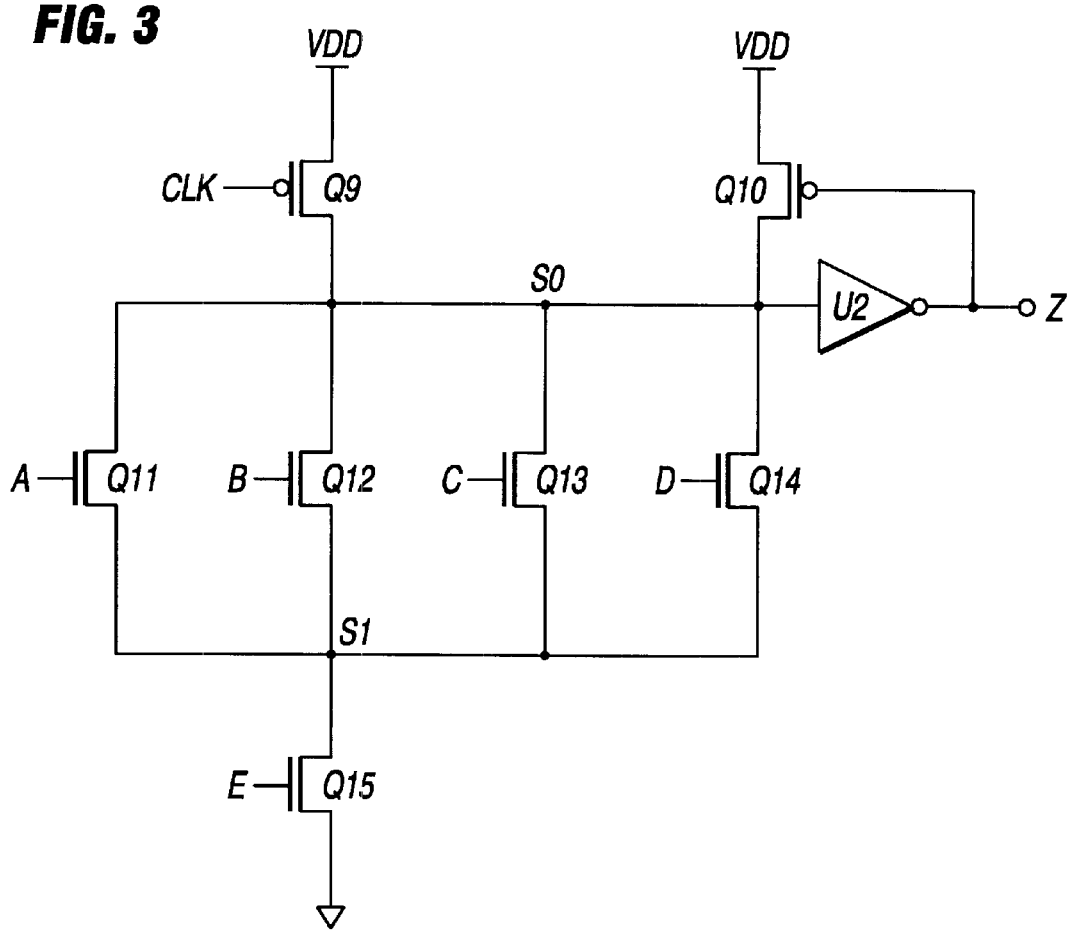

SYSTEM AND METHOD FOR IMPROVING PERFORMANCE OF DYNAMIC CIRCUITS

BACKGROUND

Dynamic devices are synchronous logic circuits that generate an output depending upon a predetermined combination of inputs for performing a logical function. Dynamic devices are characterized by two states, precharge and evaluate. In the precharge state, a precharge (or storage) node is charged to a known or predetermined voltage level. In the evaluate state, a logic section (or "tree") of pull-down transistors configured to perform a basic logical function (e.g., NAND, NOR, or combination thereof) is given the opportunity to discharge the node to a second known or predetermined voltage level or to allow the charge to persist.

The logic section is typically connected between the precharge node and a controllable virtual ground (or DNG) node. In turn, the logical function input signals are connected to the gates of one or more of the transistors in the logic section tree for activating the logic section and "sinking" the charge at the precharge node through the DNG node if the logical function inputs satisfy the particular logical function being implemented. A transistor (commonly referred to as a DNG transistor) is typically connected between the DNG node and ground, and a precharge transistor is connected between the precharge node and a supply voltage. During a precharge state (when the logical inputs are not valid), the DNG transistor is turned off, and the precharge transistor is turned on so that the precharge node charges regardless of whether the logic section conducts between the precharge and DNG nodes. On the other hand, during an evaluate state, the DNG transistor turns on, and the precharge transistor turns off, thereby allowing the logic section to discharge the precharge node if so dictated by the logical function inputs.

Dynamic circuits are typically implemented with field effect transistors ("FET"s) including both P-type ("PFET") and N-type ("NFET") transistors. For example, in one common parallel NOR configuration, a PFET transistor, with its gate connected to a clock signal, is used as the precharge transistor; an NFET transistor, with the clock signal also connected to its gate input, is used as the DNG transistor; and two or more parallel NFET transistors connected between the precharge and DNG nodes, with the logical inputs connected to their gate inputs, are used as the pull-down transistors forming the logic section. In this configuration, when the clock signal is low (precharge state), the NFET DNG transistor turns off, and the precharge PFET transistor turns on to charge the precharge node. Conversely, when the clock signal is high (evaluate state), the precharge PFET transistor turns off, and the DNG NFET transistor turns on to discharge the precharge node if the logic section is activated by the logical function inputs.

With reference to FIG. 1, a non-idealized equivalent circuit 100B is shown for a conventional FET transistor 100A (which happens to be an NFET transistor Q1). The equivalent circuit 100B comprises a parasitic bipolar junction transistor ("BJT") portion $Q1_B$ connected in parallel across a FET portion $Q1_A$. As is depicted in the equivalent circuit 100B, the FET Q1 has an associated drain leakage current, $I_L$, which has components from both the FET portion $Q1_A$ and the parasitic bipolar portion $Q1_B$. It also has a "body," which corresponds to the base of the parasitic BJT In circuit analysis and design, the body is normally not considered because with most FET manufacturing processes, it is connected to either the supply voltage or ground, which effectively eliminates its influence on the FET. However, with partially depleted silicon-on-insulator ("SOI") processes, the body is left to float between the drain and the source. This leads to several adverse effects when such FETs are used in dynamic circuits. First, it decreases the pull-down transistors' input threshold levels, which increases their leakage currents attributable to their equivalent FET portions. Second, during the evaluate state it allows the equivalent parasitic bipolar portions to be activated, which increases their leakage currents at this critical time.

A FET transistor has an associated input threshold voltage, $V_T$, that determines the required input voltage, $V_{GS}$, for turning it on. Thus, for example, with an NFET transistor, if its input voltage ($V_{GS}$) is greater than the input threshold voltage level ($V_T$), then the FET is said to be "turned on." However, even when $V_{GS}$ is less than $V_T$, there is still a finite amount of drain current, which is referred to as sub-threshold leakage current. This sub-threshold leakage current, which is part of the FET's overall leakage current, $I_L$, increases as $V_{GS}-V_T$ increases. In fact, in the subthreshold region the amount of drain current, $I_D$, that can flow through the FET is exponentially proportional to the input voltage, $V_{GS}$. Unfortunately, one physical characteristic of FET transistors is that their input threshold voltages are inversely proportional to their body voltages. For example, with NFET transistors, as their body voltages increase, their input threshold levels decrease. Thus, with partially depleted SOI NFETs whose body voltages are allowed to float upward, their input threshold voltages are lowered, which exponentially increases their leakage currents due to the ambient electrical noise at their gate inputs. When such FETs are used as pull-down transistors in dynamic circuits, this increased leakage current causes them to be more susceptible to wrongfully discharging the precharge node.

The upwardly floating body voltages impose even greater problems as a result of the parasitic BJT portions. During the precharge state, the DNG node is normally charged to a level that is approximately an input threshold voltage, $V_T$, lower than the voltage at the precharge node. This means that the body voltage will be somewhere between these two relatively high voltages. However, when the circuit evaluates, and the DNG node discharges to ground, a significant voltage drop is then induced between the body and the DNG node, which corresponds to the emitter of the parasitic bipolar transistor $Q1_B$. This forwardly biases the bipolar transistor thereby producing "collector" current, which adds to the overall FET leakage current, $I_L$. Thus, the leakage current in the logic section is significantly increased during the evaluate state, which can cause the circuit to wrongfully evaluate to a discharged level even though the logic section is not suppose to be activated based on the logical input values.

Several different solutions have been used to address this problem. With one solution, an NFET transistor with an inverted clock input is connected across the DNG transistor to bleed away the charge at the DNG node during the precharge state and thereby lower the body voltages of the pull-down transistors. This "bleed-off" transistor is sized large enough to sufficiently discharge the DNG node yet small enough to ensure that the precharge node properly charges during the precharge state. Unfortunately, this solution is disfavored because it requires three extra transistors—one transistor for discharging the DNG node and two transistors for providing an inverted clock input.

Another solution incorporates the use of an over-sized holder transistor. A holder transistor is typically used in a dynamic circuit to supply additional charge to the precharge node for "holding" it charged –even when the pull-down transistors leak charge through to the DNG node. This solution simply involves using an over-sized holder transistor for compensating against the increased pull-down transistor leakage currents caused by their increased body voltages. Unfortunately, this solution is also disfavored because it excessively slows down the circuit's ability to precharge and evaluate, which impairs its ability to operate at high-performance frequencies.

SUMMARY OF THE INVENTION

The present invention is directed to a system and method for dynamic circuits. In one embodiment, the circuit includes a precharge device, a DNG FET transistor, and at least one pull-down FET transistor with a floating body. The precharge device is connected to a precharge node for charging it during a precharge state. The DNG FET transistor is connected between a DNG node and a charge sink for operably linking the DNG node to the charge sink during an evaluate state. In addition, the DNG transistor has an associated precharge leakage current. The at least one pull-down FET transistor has an input threshold voltage whose value is inversely affected by its floating body voltage. The at least one pull-down transistor is connected between the precharge node and the DNG node for discharging the precharge node during the evaluate state if so dictated by logical function input values applied to the pull-down transistors during the evaluate state. The DNG leakage current, during the precharge state, draws a sufficient amount of charge from the DNG node to maintain the at least one pull-down transistor body voltage(s) at a sufficiently low value so that the precharge node does not wrongfully evaluate to a discharge level during the evaluate state.

BRIEF DESCRIPTION OF THE DRAWING

FIG. 1 schematically shows an equivalent circuit of an NFET transistor taking into account its parasitic bipolar characteristics.

FIG. 2 schematically shows one embodiment of a dynamic, partially-depleted SOI circuit of the present invention.

FIG. 3 schematically shows another embodiment of a dynamic, partially-depleted SOI circuit of the present invention.

DETAILED DESCRIPTION

The present invention employs an elegant solution to the logic section leakage current problems associated with partially-depleted SOI pull-down transistors in conventional dynamic circuit configurations. With the solution of the present invention, neither over-sized, retarding holder transistors nor additional components for discharging a DNG (or other interstitial) node are required. Instead, a transistor with purposefully increased leakage current for reducing the DNG precharge voltage and thereby reducing the logic section body voltages is implemented.

FIG. 2 shows one embodiment of an inventive dynamic circuit with partially-depleted SOI FET transistors. This circuit functions as a 4-input OR circuit with logical inputs at A, B, C, and D and a logical OR output at Z. The circuit generally includes a precharge transistor Q2, a holder transistor Q3, parallel NOR pull-down transistors Q4–Q7, a DNG transistor Q8, and an output inverter U1. In the depicted embodiment, the precharge and holder transistors are PFET type transistors, while the pull-down and DNG transistors are NFET type transistors. Inverter U1 is a conventional inverter such as one composed of PFET and NFET transistors configured with their gates and drains connected together.

Precharge transistor Q2 is connected between a supply voltage VDD and a precharge (or storage) node S0 for charging the precharge node during the precharge state, and its gate is connected to a clock signal CLK. The holder transistor Q3 is similarly connected between the supply voltage VDD and precharge node S0, but its gate is connected instead to output Z, which is an output of the precharge node S0 after having been inverted by inverter U1. The pull-down transistors Q4–Q7 are substantially connected in parallel with one another with their drains connected to the precharge node S0 and their sources connected to a DNG node. Each pull-down transistor Q4–Q7 has its gate input connected to a separate one of the logical inputs A, B, C, or D, respectively. Finally, the DNG transistor Q8 is connected between the DNG node and a charge sink, which in the depicted embodiment is ground.

The input threshold voltage level, $V_T$, of Q8 is sized suitably low, in relation to its surrounding noise environment, so that the DNG transistor Q8 drains enough leakage current out of the DNG node during the precharge (CLK low) state in order to maintain the DNG node voltage sufficiently low. The DNG voltage should be maintained low enough to cause the body voltages of pull-down transistors Q4–Q7 to be suitably low so that their associated input threshold voltage levels ($V'_T$) are at least at a minimally high level to avoid excessive sub-threshold leakage current during both the precharge and evaluate states. In addition, the DNG voltage level should be low enough to operably prevent the parasitic bipolar portions of the pull-down transistors from detrimentally increasing the pull-down transistor leakage currents when the circuit transitions to the evaluate state. It has been found that reducing the DNG precharge voltage by twenty percent (e.g., of what it otherwise would be when equivalent DNG and pull-down transistors are used) is sufficient. For example, in one embodiment of the parallel NOR circuit of FIG. 2 with a supply voltage of 1.5 V and input threshold levels of about 300 mV, the DNG node would normally charge to about 1.2 V during the precharge state. Thus, a DNG transistor with a suitably lower input threshold level for generating enough DNG leakage current to maintain the DNG voltage at about 0.96 V would be effective.

In order to achieve this sufficiently low DNG precharge voltage, the DNG transistor's precharge leakage current should be greater than the total amount of precharge leakage current coming out of the pull-down transistors Q4–Q7. The specific parameters (e.g., DNG threshold voltage, DNG leakage current, DNG node voltage, pull-down body voltages, pull-down threshold voltage levels) for achieving this condition will of course depend on the specific components, electrical noise environments, and circuit configuration used for a particular design. For example, in a design with a large DNG transistor (as compared with small pull-down transistors), the DNG input threshold voltage level could be relatively high because it would have an inherently larger amount of leakage current. On the other hand, the DNG input threshold level could be designed to be smaller than those of the pull-down transistors when the DNG and pull-down transistors have substantially the same dimensions. With space limitations in mind, this approach is preferred. It should be remembered that one can exponentially increase the leakage current of the DNG transistor simply by lowering its input threshold value.

The input threshold voltage of a FET transistor may be made lower (e.g., than others within its circuit) in any suitable manner. For example, additional masks can allow certain process parameters to be altered for a select number of transistors hence altering those transistors' threshold voltages. On the other hand, in many conventional integrated circuit processes, only a limited number of predefined input thresholds are allowed for any transistor within the chip. In such cases, either the best of the available thresholds could be utilized; or, for example, a selected voltage (e.g., supply voltage) could be connected to the transistor's body to force its input threshold voltage to a desired lower level. Of course, a combination of these approaches could also be implemented. That is, one could select an available transistor configuration with an input threshold value that is closest to a desired level and then "fine-tune" it by connecting its body to a suitable voltage source.

While the invention has been described primarily within the context of a parallel NOR dynamic circuit, persons of skill will readily recognize that the invention may be used with any dynamic circuit configuration that uses FETs with floating bodies. That is, regardless of how the logic section is structured, its body voltages can be lowered by lowering the DNG voltage, which can be lowered by purposefully increasing the leakage current of the DNG transistor. In addition, for that matter, the teachings of the present invention apply to other types-of dynamic circuit configurations such as those that don't even use DNG transistors.

FIG. 3 shows one example of such a circuit. The circuit of FIG. 3 has a precharge transistor Q9, a holder transistor Q10, pull-down transistors Q11–Q15, and output inverter U2. The circuit also has dynamic logical inputs at A through E and an output at Z that provides the logical result of (A+B+C+D) E. In addition, the circuit has a precharge node at S0 and an interstitial logic section node at S1. A DNG transistor is not required because the inputs at A through E are dynamic, which ensures that the pull-down transistors Q11 through Q15 are sufficiently turned off during a precharge state. However, S1 can still charge to a problematically high voltage during a precharge state thereby detrimentally increasing the body voltages of Q11–Q14. Thus, the input threshold level of Q15 is made lower than those of Q11–Q14 so that the voltage at S1 is held to a sufficiently low value during the precharge state. This works well, for example, when logical inputs A–D are subjected to excessive electrical noise, as compared with logical input E. However, even if input E is noisy, this solution could still be implemented by incorporating, e.g., a buffer at the input of Q15. It may be observed that the parallel bleed transistor solution of the prior art would not be operable for this type of dynamic configuration.

What is claimed is:

1. A dynamic circuit, comprising:
    a precharge transistor having an output connected to a precharge node for charging said precharge node during a precharge state;
    a DNG FET transistor connected between a DNG node and a charge sink for operably linking the DNG node to the charge sink during an evaluate state; and
    a logic section comprising a plurality of pull-down transistors that are connected in parallel, wherein each pull-down transistor of said plurality of pull-down transistors is connected to said precharge node and to said DNG node for discharging the precharge node during the evaluate state if so dictated by logical function inputs to the plurality of pull-down transistors, and each of said plurality of pull-down transistors has a precharge leakage current, a floating body voltage, and an input threshold level that is affected inversely by the body voltage;
    wherein the DNG FET has an associated DNG precharge leakage current that is greater than the sum of the respective precharge leakage currents from said plurality of pull-down transistors for lowering the voltage at the DNG node during the evaluate state thereby lowering each respective floating body voltage of said plurality of pull-down transistors.

2. The circuit of claim 1 wherein the DNG transistor has an associated input threshold level that inversely affects the DNG precharge leakage current, wherein the DNG input threshold voltage level is sufficiently less than the input threshold levels of said plurality of pull-down transistors so that the DNG precharge leakage current is greater than the sum of the respective precharge leakage currents from said plurality of pull-down transistors.

3. The circuit of claim 1 wherein the DNG FET transistor is a partially depleted silicon-on-insulator FET transistor.

4. The circuit of claim 3 wherein the DNG FET transistor is an NFET transistor.

5. The circuit of claim 1 wherein said plurality of pull-down transistors are NFET transistors.

6. The circuit of claim 1 further comprising a holder transistor connected to the precharge node for holding its charge during the precharge state.

7. The circuit of claim 6 wherein the holder transistor is a PFET transistor with its gate connected to an inverted version of the precharge node.

8. A dynamic circuit, comprising:
    a precharge device connected to a precharge node for charging said precharge node during a precharge state;
    a DNG FET transistor connected between a DNG node and a charge sink for operably linking the DNG node to the charge sink during an evaluate state, the DNG transistor having an associated input threshold voltage level and an associated leakage current that increases as the input threshold voltage level goes down; and
    a plurality of pull-down partially depleted silicon-on-insulator FET transistors that are connected in parallel, wherein each of said plurality of pull-down partially depleted silicon-on-insulator FET transistors is connected to said DNG node and to said precharge node, and each of said plurality of pull-down partially depleted silicon-on-insulator FET transistors has a body voltage and an input threshold voltage whose value is inversely affected by the body voltage;
    wherein the DNG leakage current, during the precharge state, draws a sufficient amount of charge from the DNG node to maintain each respective body voltage of said plurality pull-down partially depleted silicon-on-insulator FET transistors at a sufficiently low value during the precharge state for proper circuit operation during the evaluate state.

9. The circuit of claim 8 wherein the DNG input threshold voltage level is small enough, as compared with expected ambient electrical noise, to cause the DNG leakage current to be large enough to draw the sufficient amount of charge from the DNG node.

10. The circuit of claim 8 wherein the DNG FET transistor is sized to have a sufficiently large leakage current during the precharge state to draw the sufficient amount of charge from the DNG node.

11. The circuit of claim 8 wherein the DNG FET transistor is a partially depleted silicon-on-insulator FET transistor.

12. The circuit of claim 11 wherein the DNG FET transistor is an NFET transistor.

13. The circuit of claim 8 wherein said plurality of pull-down partially depleted silicon-on-insulator FET transistors are NFET transistors.

14. The circuit of claim 8 further comprising a holder transistor connected to the precharge node for holding its charge during the precharge state.

15. The circuit of claim 14 wherein the holder transistor is a PFET transistor with its gate connected to an inverted version of the precharge node.

16. A circuit, comprising:

a precharge node that is charged during a precharge state;

a ground node;

a logic section comprising a plurality of pull-down transistors for discharging the precharge node if so dictated by logical function inputs to the plurality of pull-down transistors, wherein each of said plurality of pull-down transistors has a floating body voltage, said plurality of pull-down transistors define a plurality of parallel circuit paths to said ground node that includes at least one other transistor, and each respective parallel circuit path is adapted such that precharge leakage current from each of said plurality of pull-down transistors leaks to ground to sufficiently lower each respective floating body voltage to permit proper circuit operation during an evaluate state.

17. The circuit of claim 16 wherein a gate of said at least one other transistor receives a clock signal to permit said logic section to discharge current from said precharge node to said ground node when dictated by logical function inputs to the plurality of pull-down transistors during said evaluate state.

18. The circuit of claim 16 wherein said at least one other transistor receives a logical function input.

19. The circuit of claim 16 wherein said precharge node is charged by a PFET transistor.

20. The circuit of claim 16 wherein said plurality of pull-down transistors are partially depleted silicon-on-insulator FET transistors.

21. A method for operating a circuit, comprising:

charging a precharge node during a precharge state;

draining leakage current, during said precharge state, from a plurality of parallel circuit paths defined by a plurality of pull-down transistors that are connected to logical function inputs through a DNG transistor, wherein each of said plurality of pull-down transistors has a floating body voltage, and sufficient current is drained from each of said plurality of parallel circuit paths to sufficiently lower each respective floating body voltage to permit proper circuit operation during an evaluate state; and applying a clock signal to said DNG transistor to evaluate said logical function inputs according to a logical function defined by at least said plurality of pull-down transistors during said evaluate state.

22. The method of claim 21 wherein said DNG transistor has a precharge leakage current, each of said plurality of pull-down transistors has a precharge leakage current, and the precharge leakage current of said DNG transistor is greater that the sum of the respective precharge currents of said plurality of pull-down transistors.

* * * * *